United States Patent [19]

Hartmann et al.

[11] Patent Number: 4,713,792
[45] Date of Patent: Dec. 15, 1987

[54] PROGRAMMABLE MACROCELL USING EPROM OR EEPROM TRANSISTORS FOR ARCHITECTURE CONTROL IN PROGRAMMABLE LOGIC CIRCUITS

[75] Inventors: Robert F. Hartmann, San Jose; Yiu-Fai Chan, Saratoga; Robert J. Frankovich, Cupertino; Jung-Hsing Ou, Sunnyvale; Hock C. So, Milpitas; Sau-Ching Wong, Hillsborough, all of Calif.

[73] Assignee: Altera Corporation, Santa Clara, Calif.

[21] Appl. No.: 742,089

[22] Filed: Jun. 6, 1985

[51] Int. Cl.$^4$ .............................................. G06F 1/00
[52] U.S. Cl. ............................................... 364/900
[58] Field of Search ........................ 364/900 MS File

[56] References Cited

U.S. PATENT DOCUMENTS 3,921,146 11/1975 Danco ................................ 364/900
4,524,428 6/1985 Grinberg et al. ................... 364/900

*Primary Examiner*—Raulfe B. Zache
*Attorney, Agent, or Firm*—Claude A. S. Hamrick

[57] ABSTRACT

A programmable macrocell 28 for use in an integrated circuit device including an electronic circuit 32 responsive to control signals and operative to perform particular operations selected by the control signals on input data signals and to develop commensurate output signals, and one or more architecture control circuits 30 each including a programmable EPROM device 34 which when programmed generates a logic signal of a first state and when unprogrammed generates a logic signal of a second state, a read and write control circuit 36 responsive to input program data signals and a corresponding address signal and operative to program the EPROM device 34 by applying a programming potential thereto, and a sensing circuit 38 for sensing the programmed or unprogrammed status of the EPROM device 34 and for developing a commensurate control signal for input to the electronic circuit 32.

19 Claims, 7 Drawing Figures

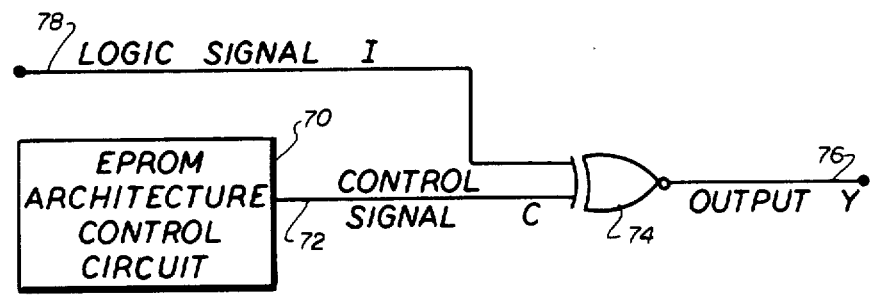
FIG_ 4
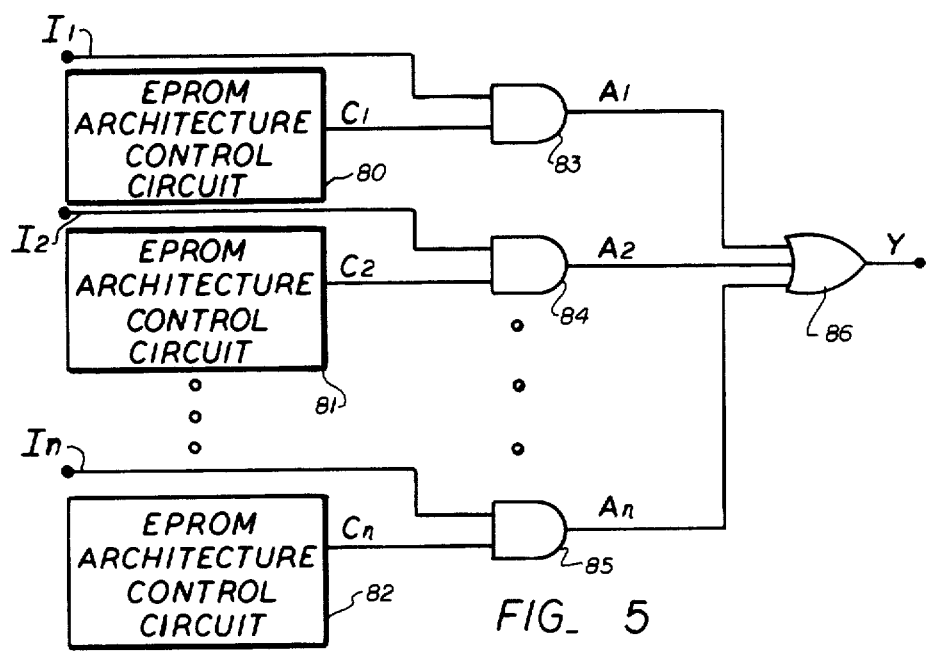
FIG_ 5

PROGRAMMABLE MACROCELL USING EPROM OR EEPROM TRANSISTORS FOR ARCHITECTURE CONTROL IN PROGRAMMABLE LOGIC CIRCUITS

BACKGROUND OF THE INVENTION

1. Field of the Invention

The present invention relates generally to programmable logic circuitry, and more particularly, to the use of EPROM or EEPROM transistor elements in programmable integrated circuit logic array devices for the purpose of architecture control.

2. Description of the Prior Art

In the use of integrated circuit devices (ICs) it is desirable that the devices be programmable so that their operation may be tailored to fit particular applications. Furthermore, it is desirable that a menu of features be provided from which an end user of the IC can choose to best suit his particular application. Selection of items from a menu can be described as configuring the architecture of the IC and various means of selecting IC architectures are currently used. Two commonly used methods are (1) to provide mask options and (2) to provide "mode" or "control" registers (storage elements) whose register outputs act as architecture controls. However, each of these methods have associated disadvantages.

The first method referred to, i.e. wherein masks used to manufacture the IC are programmed, has the drawback that the configuration of the IC must be implemented during the manufacturing process. Typically, such programming is accomplished during the metal masking step in the production of the IC. The disadvantage of this approach is that configuration selections must be made prior to completion of the manufacturing operation, thereby causing long lead times and many production and inventory problems associated with manufacturing, testing and inventorying the custom IC devices. In addition if changes are later required all previous inventory that has matured beyond the point in manufacturing where customization takes place will be obsolete and thus useless.

The second method, i.e. the use of mode registers, solved the lead time, manufacturing and inventory problems in that the IC parts could be configured by the user after manufacture was completed. In other words, if changes were required, the IC device could be reprogrammed by writing new values into the mode register. The disadvantage of this approach is that register data is lost when power is removed from the system. As a consequence, applications of devices having such feature are limited.

SUMMARY OF THE PRESENT INVENTION

It is therefore a principal objective of the present invention to provide an improved method and apparatus for providing selective architecture control in programmable logic array devices.

Another object of the present invention is to provide apparatus in which EPROM or EEPROM transistors are used to permit selective architectural control in IC devices.

Another object of the present invention is to provide selectible circuit means for incorporation in IC devices so as to enable a user to custom-tailor the circuit architecture of the IC device.

Still another object of the present invention is to provide an EPROM architecture control circuit for inclusion in an integrated circuit macrocell to permit erasable programming of the function of such macrocell.

A still further object of the present invention is to provide a programmable macrocell in which EPROM devices are used as the programmable elements.

Briefly, a preferred embodiment of the present invention includes a circuit which employs EPROM (or EEPROM) transistors to provide selective architecture control in an IC device. The basic circuit is comprised of an EPROM transistor in combination with read and write control circuitry and sense circuitry. Typically, the drain and gate of the EPROM transistor is controlled by the read and write control circuitry while the source of the transistor is connected to ground. The sense circuitry is also connected to the drain of the transistor and is used to determine the programmed or unprogrammed state thereof, and in response to produce an output signal which is used to control other circuitry in the IC device.

Among the advantages of the present invention is that the use of EPROM transistors for architecture control solves many of the problems associated with prior art devices. For example, no metal mask options are required, thus no custom inventory need be accumulated. Furthermore, the EPROM (or EEPROM) transistors take the place of the mode register of the prior art, but have the advantage that once programmed, they will not lose their programming should power to the IC device be lost. In addition, changes in programming can be accomplished by erasing and then re-programming the EPROM.

These and other objects and advangages of the present invention will no doubt become apparent to those skilled in the art after having read the following detailed description of the preferred embodiments which are illustrated in the several figures of the drawing.

IN THE DRAWING

FIG. 4 is a diagram schematically illustrating use of the present invention in an inversion control circuit;

FIG. 5 is a diagram schematically illustrating use of the present invention in a digital multiplexer circuit;

DETAILED DESCRIPTION OF THE PREFERRED EMBODIMENT

Figure 1:
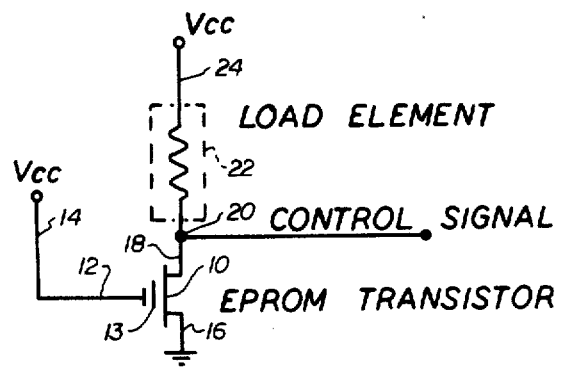
FIG. 1 is a schematic diagram illustrating an EPROM transistor configured for use as an architectural control element.

By way of introduction, a schematic diagram is shown in FIG. 1 of a well known prior art EPROM switching circuit which can be used in accordance with the present invention to generate a control signal. For purposes of this discussion an N-channel transistor is representationally shown, it being understood that a P-channel device could similarly be used. Furthermore, it is to be understood that the term EPROM is intended to include both EPROM and EEPROM devices. In FIG. 1, the EPROM transistor 10 has a gate 12 connected to an input terminal 14, a source 16 connected to circuit ground, and a drain 18 connected to an output node 20 and through a load resistor 22 to a supply voltage Vcc at a terminal 24.

If it is assumed that a floating gate 13 of the transistor is initially unprogrammed then the transistor can be expected to work as follows. Whenever a positive voltage greater than a certain threshold voltage (Vt) is applied to the control gate 12, a channel will be induced under the gate region of the transistor, which allows current to flow between the drain region and the source region. In a typical N-channenl floating gate device Vt is approximately 1.5 volts. The signals which are typically applied to a control gate are normally between 0 volts and 5 volts. With no input voltage applied to terminal 14, it will be appreciated that transistor 10 will be in a nonconducting or OFF state and node 20 will be pulled up through load element 22 to Vcc and thus be in a logic 1 state.

If on the other hand, an input voltage Vcc (nominally +5 volts) is applied to the gate 12, transistor 10 will be caused to conduct (turn ON) creating a current path between terminal 24 and circuit ground through load element 22. The load element 22 and transistor 10 are designed such that the control signal appearing at node 20, with transistor 10 conducting, will be less than the threshold voltage of a circuit to be controlled by the control signal. Thus, with transistor 10 turned ON, node 20 will be pulled toward ground potential and will thus be at a logic 0 state.

The effective threshold of transistor 10 will be changed by causing charges to be trapped on the floating gate 13. More particularly, electrons can be caused to flow to the floating gate 13 by applying a high voltage (typically 21 volts) to the control gate and the drain (by means not illustrated). When the high voltage is removed, charges will remain trapped on the floating gate 13 and cause the effective threshold of the device to be increased to a value greater than the voltage which would normally be applied to the control gate 12. The application of such high voltage and the subsequent charge trapping on the floating gate 13 is called "programming".

After transistor 10 has been programmed, if a 5 volt signal such as Vcc is applied to gate 12 no channel will be created between the source and drain, and no current will flow therebetween. Accordingly, transistor 10 will remain in its OFF condition causing node 20 to be pulled up to Vcc through load element 22. The control signal developed at node 20 will thus be greater than the threshold voltage of the circuit to be controlled, and will thus be considered to be at a logic 1 state.

The EPROM device can thus be thought of as a programmable switch. In the unprogrammed state, the switch opens and closes in response to the application of 0 volts or 5 volts, respectively, to the control gate 12. On the other hand, in the programmed state the switch will always be open regardless of whether 0 volts or 5 volts is applied to control gate 12. Under normal environmental conditions charges will stay trapped on the floating gate for very long periods of time, typically greater than 10 years.

Figure 2:
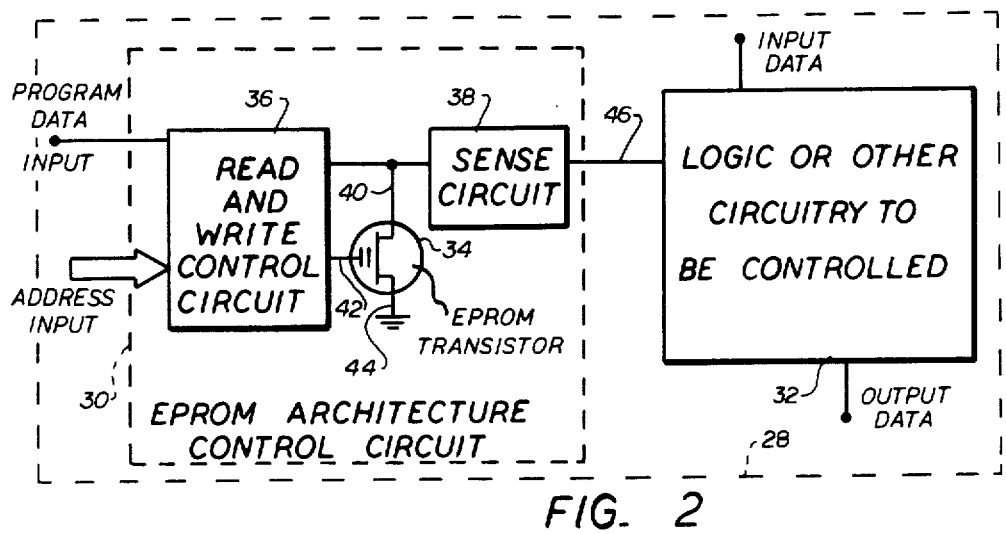
FIG. 2 is a generalized block diagram showing the basic components of an architecture control circuit in accordance with the present invention.

Referring now to FIG. 2. of the drawing. A generalized block diagram is presented representatively showing a macrocell 28 including an architectural control circuit 30 connected to logic or other circuitry 32 to be controlled. In accordance with the present invention, circuit 30 is comprised of an EPROM (or EEPROM) transistor 34, Read and Write Control subcircuitry 36, and sense subcircuitry 38. Typically, the drain 40 and gate 42 of transistor 34 will be controlled by the Read and Write Control circuit 36, while the source 44 of the transistor is tied to ground. The sense circuit 38 couples the drain 40 to the circuitry 32 to be controlled. Furthermore, circuit 38 "senses" the programmed or unprogrammed state of transistor 34 and produces a corresponding logic 1 or logic 0 output signal at 46 which is used to control one or more subcircuits of circuitry 32.

Although illustrated as a single EPROM architecture control circuit 30, in the usual case a plurality of such circuits are combined to allow selective characterization of the operation of a particular logic or other circuit such as that depicted at 32. It will be appreciated, however, that the intended function of the several architecture control circuits is to input logic 1's and 0's to particular gates of the controlled circuit thus allowing the operational characteristics of such circuit to be tailored to fit a particular application.

Figure 3:
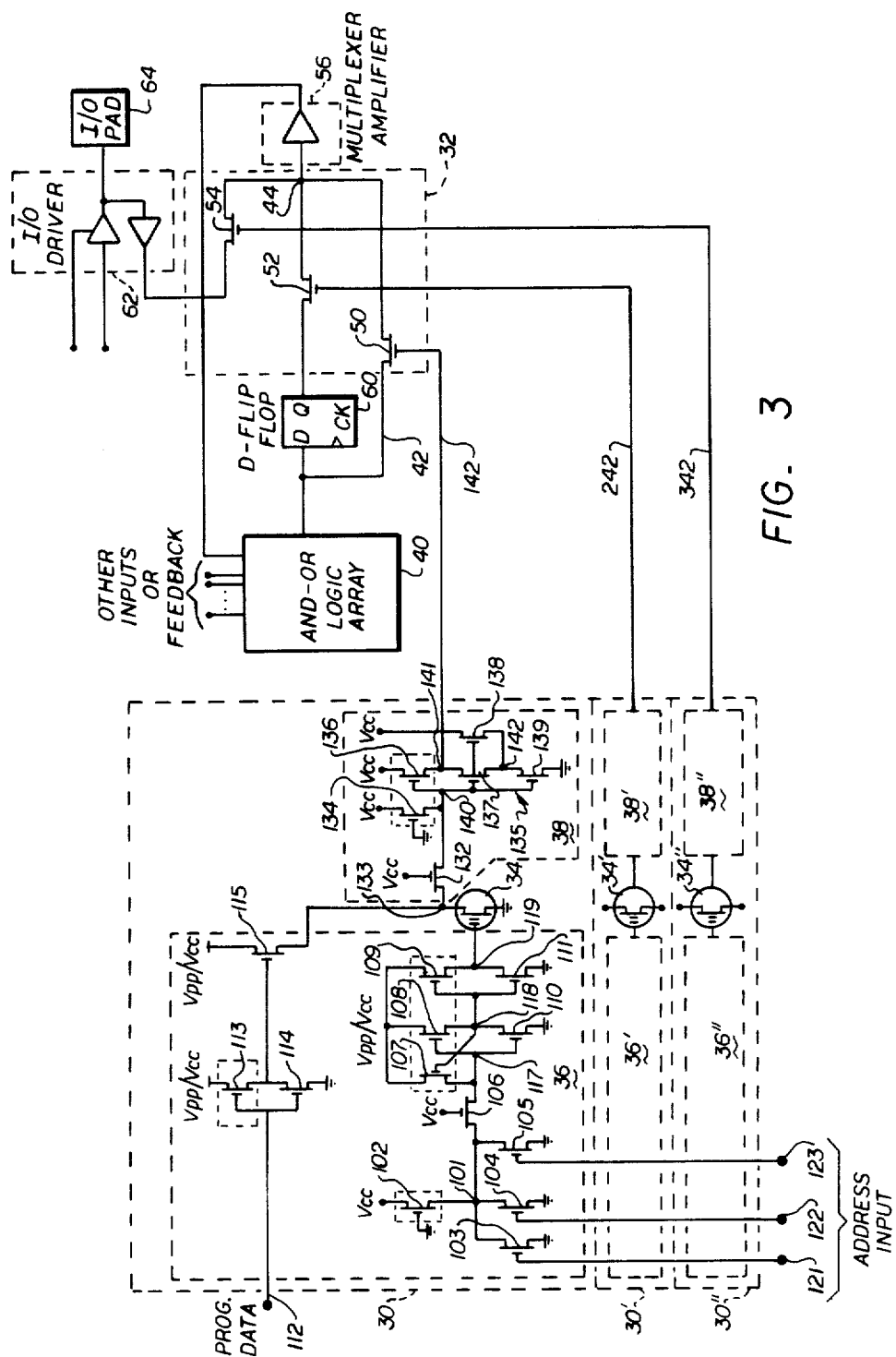
FIG. 3 is a schematic circuit illustrating specific embodiments of the present invention used in a transmission gate multiplexor circuit.

Turning now to FIG. 3 of the drawing, a detailed schematic of an embodiment of the present invention is shown in an application in which EPROM control circuits are used to control a Transmission Gate Multiplexer circuit. In this embodiment, three Architectural Control circuits 30, 30' and 30" are shown in combination with multiplexing circuitry generally indicated at 32, which is in turn used to control the signal communication between the output, feedback and I/O of an AND-OR Logic Array 40. The overall architectural control system includes the three control circuits 30, 30' and 30" which respectively include the Read and Write Control subcircuits 36, 36' and 36" the EPROMs 34, 34' and 34" and the sense subcircuits 38, 38' and 38".

As mentioned, the circuitry 32 to be controlled is a three input transmission gate multiplexor consisting of switching transistors 50, 52 and 54 which forms part of an AND-OR array macrocell of the type disclosed in co-pending U.S. patent application Ser. No. 06/607,018 filed May 3, 1984 and assigned to the assignee of the present application. As illustrated, transistor 50 selectively connects the output of AND-OR array 40 to an amplifier 56 in a feedback loop, transistor 52 selectively connects the output of a D-flip-flop to amplifier 56, and transistor 54 selectively connects I/O pad 64 to amplifier 56 via an I/O driver 62. It will be appreciated that by means of the control circuits 30, any combination of the gates 50–54 may be actuated to specially configure the illustrated array.

Referring now to circuit 30, observe that control circuit 36 is comprised of a P-channel load transistor 102, three pull-down transistors 103, 104 and 105, the gates of which are connected to address terminals 121, 122, and 123, a blocking transistor 106, a level shifter or translator circuit consisting of three P-channel transistors 107, 108, and 109, and two N-channel transistors 110 and 111, the output of the translator circuit being connected to the gate of EPROM 34. Circuit 36 also includes a P-channel transistor 113 and an N-channel transistor 114 the gates which are connected to a program data input terminal 112 and invert an input applied thereto, and a transistor 115 the gate of which is connected to the drains of transistors 113 and 114. The source 116 of transistor 115 is connected to the drain of EPROM 34.

Sense circuit 38 includes a gating transistor 132, a P-channel load device 134 and a Schmidt Trigger Circuit 135 including a P-channel transistor 136 and N-channel transistors 137-139. The output node 141 of Schmidt trigger circuit 135 is coupled to the gate of transistor 50 of the multiplexing circuit 32.

Similarly, the other two (or more) control circuits consisting of read/write circuits 36' and 36", EPROM transistors 34' and 34" and sense circuits 38' and 38" are respectively coupled to the gates of transistors 52 and 54. It should be understood that each of the circuits 36, 36' and 36" share a common data line 112 and common address lines 121-123. The use of inverters to interface appropriate address lines to 36' and 36" allow selection of a particular one of the EPROMs 34', 34" to be programmed by the data signal input on the program data input line.

Operation of the illustrated circuit may be explained as follows:

Assume initially that the EPROM transistors 34, 34' and 34" are in their erased state and it is desired to write a value to the floating gates. For purposes of this discussion a description of the "Write" operation for only transistor 34 will be given although such operations for 34' and 34" will be similar. During writing, the Vpp/Vcc line is switched to Vpp (typically 21 volts). Transistor 102 serves as a load transistor and transistors 103, 104 and 105 are pull down transistors making up a 3 input NOR gate. If the address inputs 121, 122, and 123 are all logic 0 then the output of the NOR gate at node 101 will be a logic 1. With Vcc at the gate of transistor 106 it will be rendered conductive and the logic 1 will be passed to node 117. Because the gate of transistor 106 is connected to Vcc, the initial node voltage at 117 will be Vcc-Vt, or approximately 4 volts. This will be high enough to turn transistor 110 ON, but not enough to turn P-channel transistor 108 OFF.

With transistor 110 ON, node 118 begins to be pulled toward ground. This turns P-channel transistor 107 ON and pulls node 117 toward Vpp which turns transistor 108 fully OFF. With node 118 at ground, N-channel transistor 111 is OFF and P-channel transistor 109 is ON causing node 119 to be pulled up to Vpp which is the desired programming gate voltage for EPROM transistor 38. Line 112 contains the data to be programmed. If the data on line 112 is a logic 0, then transistor 115 will be turned ON and the EPROM transistor 34 will be programmed as the drain 133 of transistor 34 is pulled to Vpp through N-channel transistor 115. If the signal input on line 112 is a logic 1 transistor 115 will remain OFF and the EPROM transistor will not be programmed.

Once the EPROM transistor 34 is programmed, it can be sensed by Sense circuit 38. During the normal operation (after programming), line 112 is forced to a logic 1, Vpp/Vcc is forced to Vcc and lines 121, 122 and 123 are forced to logic 0, thus node 119 will be at a Vcc level.

The Sense circuit works as follows: First, assume that transistor 34 is in its erased state. With 5 volts applied to its gate it will be turned ON. P-channel transistor 134 acts as a load element for transistor 34 through pass gate transistor 132. The sizes of transistors 132, 134 and EPROM 34 are chosen such that node 40 will be near ground (logic 0) when EPROM 34 is in its erased state.

This level is sensed by Schmidt trigger circuit 135. A logic 0 on node 140 produces a logic 1 on node 141. Thus, an erased EPROM (unprogrammed) transistor will be sensed as a logic 1.

Next, assume that the EPROM 34 has been programmed and is in its OFF state. Then with 5 volts on its gate it will still be in an OFF configuration. This will be sensed by the Schmidt trigger and a logic 0 will be output at 141. Thus, a programmed EPROM transistor produces a logic 0 at node 141.

In a similar manner, EPROM transistors 34' and 34" can be programmed by their respective Read/Write Control circuits 36' and 36". Having programmed EPROM transistors 34 34' and 34", the control signals developed on lines 142, 242 and 342 are used to control the transmission multiplexer (TMUX). Typically, in a TMUX only one path is active. For example, assume the gate of transistor 50 is at a logic 1, and the gates of transistors 52 and 54 are at logic 0, then data from the AND/OR Logic Array 40 will be passed via line 42 through transistor 50 to node 44 where it will be amplified by the multiplex amplifier 56 and (in this illustration) passed back to the AND/OR Array 40. If transistor 52 had been selected (rather than 50) than data from the D flip-flop 60 would have been fed back to the AND/OR Array 40. If transistor 54 had been selected, then I/O pad data would have been passed through amplifier 56 to the AND/OR Array 40.

Many other circuits can also be controlled by EPROM architecture control circuits of the type described. For example, FIG. 4 shows an inversion control circuit (of the type disclosed by Brickman et al in "Programmable Logic Array Enhancement", IBM Tech. Disclosure Bulletin, p. 583, Vol. 19, No. 2, July 1976). in which an EPROM architecture control circuit 70 in accordance with the present invention generates a control signal C on a control line 72. By applying the control signal C to one input of an exclusive NOR gate 74, the output signal Y at 76 will be either the same as, or the logical inversion of, the logic signal I input at 78. The following truth table illustrates the application:

| C | I | Y |
| --- | --- | --- |
| 0 | 0 | 0 |
| 0 | 1 | 1 |
| 1 | 0 | 1 |
| 1 | 1 | 0 |

It will thus be appreciated that when C=0, Y=I, and when C=1, Y=$\bar{I}$.

FIG. 5 illustrates a digital multiplexer in which a plurality of EPROM architecture control circuits 80, 81 and 82, provide control signals C1, C2, . . . Cn for the multiplexing circuitry consisting of AND gates 83, 84 and 85, the outputs of which are fed into an OR gate 86. The output Y of OR gate 86 will be the logical OR of all signals I1, I2, . . . . . In whose control signals C1, C2 . . . Cn are set to logic 1. The logic equation for this circuit is:

$$Y = C1I1 + C2I2 + \ldots Cn \cdot In$$

By way of example, if C1=0, C2=1, and C3 through Cn=0, then Y=I2.

Figure 6:
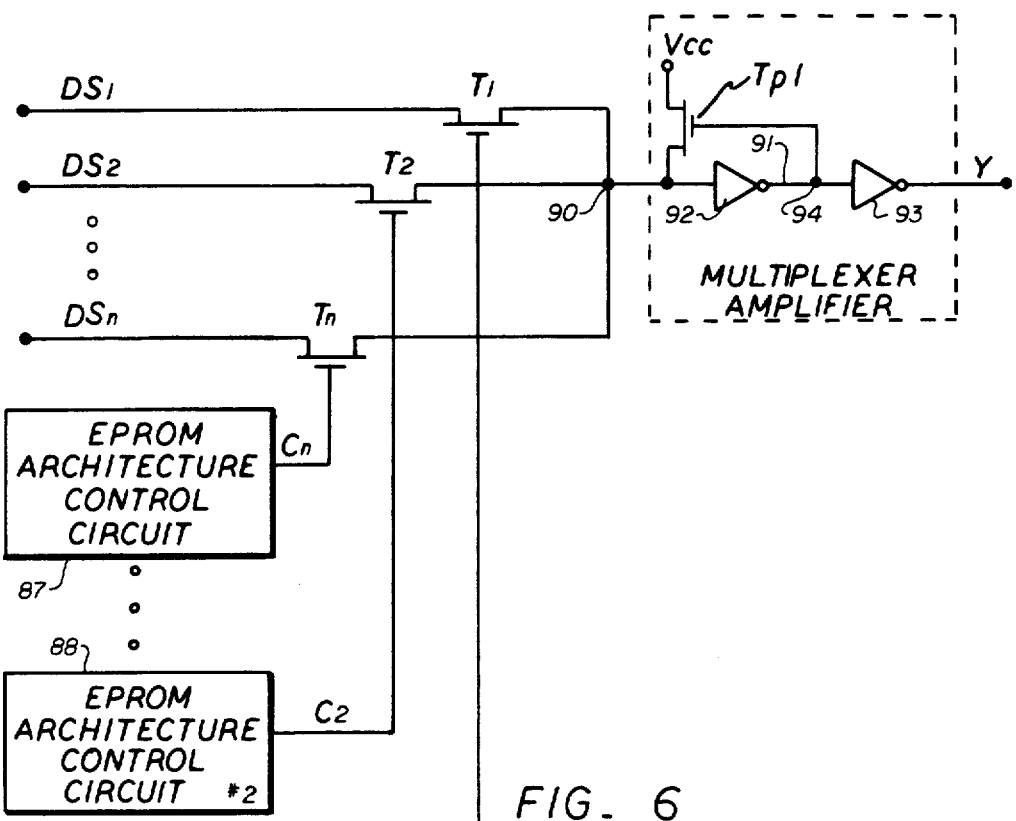
FIG. 6 is a diagram schematically illustrating use of the present invention in a transmission gate multiplexer circuit.

In FIG. 6 another version of a multiplexer circuit is shown wherein pass gates T1, T2 . . . Tn are controlled by EPROM architecture control circuits 87, 88, and 89.

In this type of circuit, normally referred to as a Transmission Gate Multiplexer, only one of the pass gates can be enabled or a conflict will exist at node 90 and the output signal Y will be indeterminate. Assuming only one control signal, for example C1, is at a logic 1 state then the circuit works as follows: Transistor T1 is turned ON and transistors T2 . . . Tn are turned OFF. Signal DS1 will then be passed to node 90. If DS1 is a logic 0, then node 90, will also be pulled to logic 0, and the output 91 of inverter 92 will be at logic 1, which turns OFF transistor TP1. The output Y from inverter 93 will thus be at logic 0.

Next, assume DS1 goes to a logic 1. Initially node 90 can only go as high as Vcc-Vt (assuming the logic 1 level of C1 is Vcc). Inverter 92 is designed such that Vcc-Vt is enough to begin pulling node 94 low. This will turn Tp1 ON and pull node 90 to Vcc. Output Y will then go to logic 1 in response to a logic 0 at node 94.

Figure 7:
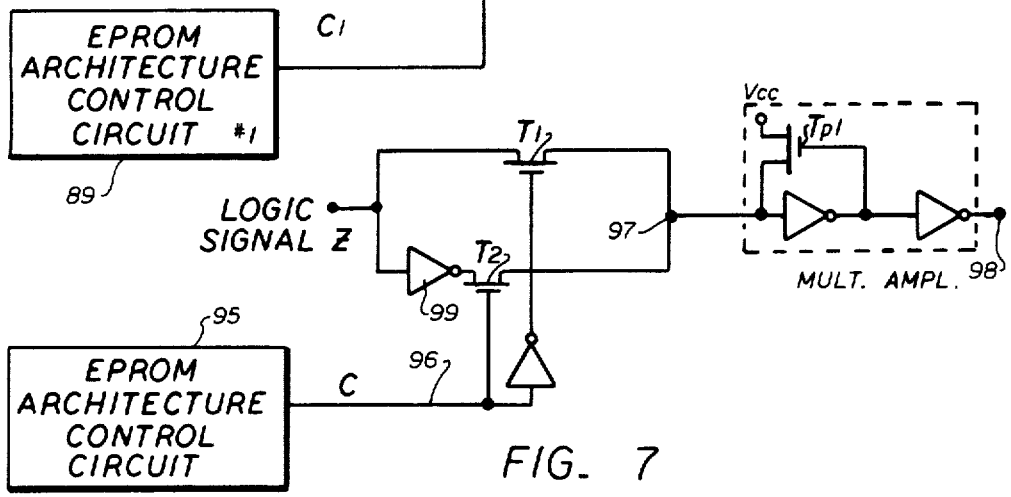
FIG. 7 is a diagram schematically illustrating use of the present invention in a transmission gate inversion control circuit.

In FIG. 7 a special case of the transmission gate multiplexer is shown in which an EPROM architectural control circuit 95 is used to accomplish inversion control. In this circuit, two transmission gates T1 and T2 are controlled by an EPROM architecture control bit C. Depending upon the state of the invert control line 96, either T1 will be ON and T2 will be OFF or T1 will be OFF and T2 will be ON. If T1 is ON, the logic signal Z will be passed to node 97 and thereafter through the multiplexer amplifier (as in FIG. 6) to the output 98. In this case, the output 98 will have the same logical values as input Z. If, on the other hand, T2 is ON, the logic signal Z will be inverted by the inverter gate 99 and passed to node 97 and thence to the output 98. In this case, output 98 will be the logical complement of the input signal Z. Thus, the circuit shown in FIG. 7 acts as a programmable inverter under control of an EPROM control bit.

Although the present invention has been described above with regard to a particular preferred embodiment which can be utilized as the control means for several different types of circuits, it is contemplated that other circuits and embodiments will become apparent to those skilled in the art after having read the above disclosure. It is therefore intended that the following claims be interpreted as covering all such circuits and embodiments as fall within the true spirit and scope of the invention.

What is claimed is:

1. A programmable macrocell in an integrated circuit device comprising:
    electronic circuit means responsive to a program control signal and operative to perform a particular operation selected by said control signal on an input data signal and to develop a commensurate output data signal, said electronic circuit means including an inversion control circuit having exclusive NOR gate means with one input thereof receiving said control signal and another input thereof receiving said input data signal; and
    architecture control means including one or more architecture control circuits each having
        a programmable EPROM device having gate, drain and source electrodes and which when programmed generates a logic signal of a first state and when unprogrammed generates a logic signal of a second state,
        read and write control means connected to said EPROM device and responsive to an input program data signal and a corresponding address signal and operative to program said EPROM device by applying a programming potential thereto, and
        sense means connected to said EPROM device for sensing the programmed or unprogrammed state of said EPROM device and for developing a commensurate control signal for input to said inversion control circuit,
    whereby in response to said control signal said inversion control circuit causes an input data signal to be inverted when an associated EPROM device is in said first state and to be not inverted when said EPROM device is in said second state.

2. A programmable macrocell as recited in claim 1 wherein said read/write control means includes a programming circuit responsive to said program data signals and operative to apply said programming potential to the drain electrode of said EPROM device, a NOR gate responsive to said address signal and operative to develop a logic output, and switching means responsive to said logic output of said NOR gate and operative to couple said programming potential to the gate electrode of said EPROM device to effect programming thereof.

3. A programmable macrocell as recited in claim 2 wherein said architecture control circuits are implemented using EEPROM devices rather than EPROM devices.

4. A programmable macrocell as recited in claim 2 wherein said programming circuit includes a first transistor switching element for coupling said programming potential to the drain electrode of said EPROM device and an inverting circuit coupled to the gate electrode thereof for inverting said program data signal.

5. A programmable macrocell as recited in claim 4 wherein said architecture control circuits are implemented using EEPROM devices rather than EPROM devices.

6. A programmable macrocell as recited in claim 4 wherein said sense means includes a Schmidt trigger circuit coupled to the drain electrode of said EPROM device and operative to develop a control signal corresponding to the state of the logic signal generated by said EPROM device.

7. A programmable macrocell as recited in claim 6 wherein said architecture control circuits are implemented using EEPROM devices rather than EPROM devices.

8. A programmable macrocell as recited in claim 1 wherein said architecture control circuits are implemented using EEPROM devices rather than EPROM devices.

9. A programmable macrocell in an integrated circuit device comprising:
    architecture control means including a plurality of architecture control circuits each having
        a programmable EPROM device including gate, drain and source electrodes which when programmed generates a logic signal of a first state and when unprogrammed generates a logic signal of a second state,
        read and write control means connected to said EPROM device and responsive to an input program data signal and a corresponding address signal and operative to program said EPROM device by applying a programming potential thereto, and sense means connected to said EPROM device for sensing the programmed or unprogrammed state of said EPROM device and for developing a commensurate control signal; and electronic circuit means responsive to said control signals and operative to perform particular operations selected by said control signals on input data signals and to develop commensurate output data signals, said electronic circuit means including a digital multiplexer means having a plurality of AND gates each of which receives at least one input data signal and a control signal developed by said architecture control means, the outputs of said AND gates being ORed together in an output OR gate which in turn develops an output signal corresponding to one of said input data signals as selected by a particular one of said control signals.

10. A programmable macrocell as recited in claim 9 wherein said read and write control means includes a programming circuit responsive to said program data signal and operative to apply said programming potential to the drain electrode of said EPROM device, a NOR gate responsive to said address signal and operative to develop a logic output, and switching means responsive to said logic output of said NOR gate and operative to couple said programming potential to the gate electrode of said EPROM device to effect programming thereof.

11. A programmable macrocell as recited in claim 10 wherein said programming circuit includes a first transistor switching element for coupling said programming potential to the drain of said EPROM device and an inverting circuit coupled to the gate electrode thereof for inverting said program data signal.

12. A programmable macrocell as recited in claim 11 wherein said sense means includes a Schmidt trigger circuit coupled to the drain electrode of said EPROM device and operative to develop a control signal corresponding to the state of the logic signal generated by said EPROM device.

13. An integrated circuit device comprising:
electronic logic circuit means responsive to at least one control signal and operable to perform a particular logic function on at least one input data signal to generate at least one commensurate output signal; and programmable control means for causing said logic circuit means to have particular circuit configurations, and including:
a first reprogrammable memory device which may be programed to generate either a logic signal of a first state or a logic signal of a second state;
a first programming means connected to said first reprogrammable memory device and responsive to input program data signals and a corresponding address signal and operative to program said first reprogrammable memory device by applying a programming potential thereto;
a first sense means connected to said first reprogrammable memory device for sensing the state of the logic signal generated by said first reprogrammable memory device and for developing a commensurate first control signal for controlling said logic circuit means.

14. An integrated circuit device as recited in claim 13 wherein said electronic logic circuit means includes an exclusive NOR gate.

15. An integrated circuit device as recited in claim 14 wherein said first memory device is an EPROM transistor.

16. An integrated circuit device as recited in claim 14 wherein said first memory device is an EEPROM transistor.

17. An integrated circuit device as recited in claim 13 wherein said programmable means further includes
a second reprogrammable memory device which may be programmed to generate either a logic signal of a first state or a logic signal of a second state;
a second programming means connected to said second reprogrammable memory device and responsive to input program data signals and a corresponding address signal and operative to program said second reprogrammable memory device by applying a programming potential thereto;
a second sense means connected to said second reprogrammable memory device for sensing the state of the logic signal generated by said second reprogrammable memory device and for developing a commensurate second control signal for controlling said logic circuit means;

and wherein said logic circuit means includes
a first AND gate having a first input for receiving a first input data signal, and a second input for receiving said first control signal and operative to generate a first intermediate data signal;
at least a second AND gate having a first input for receiving a second input data signal, and a second input for receiving said second control signal and operative to generate a second intermediate data signal; and
an OR gate responsive to said first and second intermediate data signals and operative to generate said output signal.

18. An integrated circuit device as rectied in claim 17 wherein said first and second reprogrammable memory devices are EPROM transistors.

19. An integrated circuit device as recited in claim 17 wherein said first and second reprogrammable memory devices are EEPROM transistors.

* * * * *